(12) United States Patent
Kaigawa et al.

(10) Patent No.: US 7,893,601 B2
(45) Date of Patent: Feb. 22, 2011

(54) (LI, NA, K)(NB, TA) $O_3$ BASED PIEZOELECTRIC MATERIAL

(75) Inventors: Kazuyuki Kaigawa, Kitanagoya (JP); Hirofumi Yamaguchi, Komaki (JP)

(73) Assignee: NGK Insulators, Ltd., Nagoya (JP)

( * ) Notice: Subject to any disclaimer, the term of this patent is extended or adjusted under 35 U.S.C. 154(b) by 150 days.

(21) Appl. No.: 12/267,717

(22) Filed: Nov. 10, 2008

(65) Prior Publication Data

US 2009/0121589 A1 May 14, 2009

(30) Foreign Application Priority Data

Nov. 14, 2007 (JP) .............................. 2007-295936

(51) Int. Cl.
*H01L 41/187* (2006.01)
(52) U.S. Cl. ................................ 310/358; 252/62.9 PZ
(58) Field of Classification Search ................ 310/358; 501/134; 257/347; 252/62.9 R, 62.9 PZ
See application file for complete search history.

(56) References Cited

U.S. PATENT DOCUMENTS

| | | | | |
|---|---|---|---|---|
| 5,366,718 | A * | 11/1994 | Sato et al. | 423/594.1 |
| 6,419,848 | B1 * | 7/2002 | Qiu et al. | 252/62.9 R |
| 7,323,806 | B2 * | 1/2008 | Shibata et al. | 310/358 |
| 7,477,004 | B2 * | 1/2009 | Nanataki et al. | 310/358 |
| 7,518,293 | B2 * | 4/2009 | Shibata et al. | 310/358 |
| 7,728,493 | B2 * | 6/2010 | Koizumi et al. | 310/358 |
| 2006/0006360 | A1 * | 1/2006 | Takao et al. | 252/62.9 R |
| 2006/0158068 | A1 * | 7/2006 | Shimizu et al. | 310/358 |
| 2008/0290315 | A1 * | 11/2008 | Lee et al. | 252/62.9 PZ |
| 2008/0302996 | A1 * | 12/2008 | Yura et al. | 252/62.9 R |
| 2009/0072673 | A1 * | 3/2009 | Fujii et al. | 310/358 |

FOREIGN PATENT DOCUMENTS

| | | | |
|---|---|---|---|
| JP | 2000079689 A | * | 3/2000 |
| JP | 2002084012 A | * | 3/2002 |
| JP | 2006-028001 A1 | | 2/2006 |

OTHER PUBLICATIONS

U.S. Appl. No. 12/343,689, filed Dec. 24, 2008, Kaigawa et al.
U.S. Appl. No. 12/495,830, filed Jul. 1, 2009, Kaigawa et al.
Masato Matsubara et al., "*Effect of Li Substitution on the Piezoelectric Properties of Potassium Sodium Niobate Ceramics*," Japanese Journal of Applied Physics, vol. 44, No. 8, 2005, pp. 6136-6142.
Evelyn Hollenstein et al., "*Piezoelectric Properties of Li- and Ta-Modified $(K_{0.5}Na_{0.5})NbO_3$ Ceramics*," Applied Physics Letters 87, (2005) 182905-1-3.
Yiping Guo, et al., "*Phase Transitional Behavior and Piezoelectric Properties of $(Na_{0.5}K_{0.5})NbO_3$-$LiNbO_3$ Ceramics*," Applied Physics Letters, vol. 85, No. 18, Nov. 1, 2004, pp. 4121-4123.
Yasuyoshi Saito et al., "*Lead-Free Piezoceramics*," Nature, 432, 2004, pp. 84-87.

* cited by examiner

*Primary Examiner*—J. SanMartin
(74) *Attorney, Agent, or Firm*—Burr & Brown

(57) ABSTRACT

Manufacturing sintered bodies having microstructures including microscopic grains having a grain diameter of less than 5 μm, intermediate grains having a grain diameter of 5 μm or more and less than 15 μm, and coarse grains having a grain diameter of 15 μm or more and 100 μm or less enables to obtain high electric characteristics. Chemical compounds including metal elements are mixed so that the ratio of the elements is a composition expressed by (Li, Na, K)(Nb, Ta)$O_3$, the mixture is calcined and crushed to obtain calcined/crushed powder. The powder is sintered in a constant temperature keeping process wherein temperature is kept constantly at a predetermined temperature within a range from 800 to 900° C. for a predetermined period of time in a heating process, and then the powder is further sintered by raising temperature to firing temperature, thereby the piezoelectric materials having superior electric characteristics are manufactured.

8 Claims, 3 Drawing Sheets

EXAMPLE 2
(KEEPING TEMPERATURE AT 850°C FOR 3 HOURS)

EXAMPLE 4
(KEEPING TEMPERATURE AT 850°C FOR 6 HOURS)

EXAMPLE 5
(KEEPING TEMPERATURE AT 850°C FOR 10 HOURS)

COMPARATIVE EXAMPLE 1 (NOT KEEPING)

FIG. 5  COMPARATIVE EXAMPLE 3
(KEEPING TEMPERATURE AT 850°C FOR 20 HOURS)
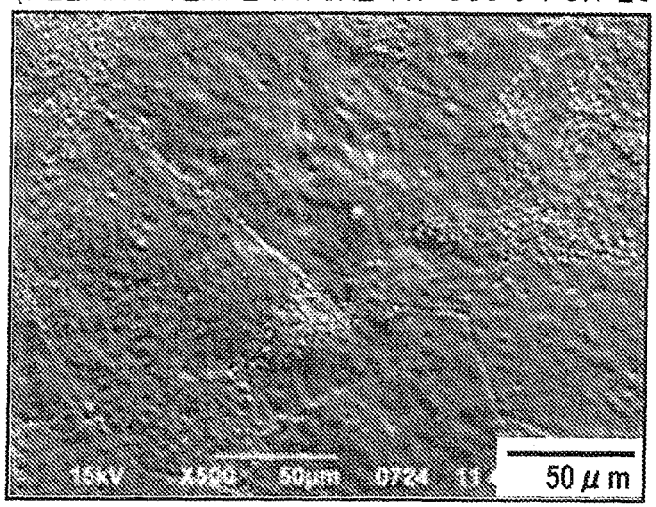

ns
(LI, NA, K)(NB, TA) O$_3$ BASED PIEZOELECTRIC MATERIAL

TECHNICAL FIELD

The present invention relates to (Li, Na, K)(Nb, Ta)O$_3$ based piezoelectric materials used for actuators or sensors and manufacturing methods thereof.

BACKGROUND ART

A piezoelectric/electrostrictive actuator has an advantage that displacement can precisely be controlled in the order of submicrons. Especially, in the piezoelectric/electrostrictive actuator in which a sintered body of a piezoelectric/electrostrictive porcelain composition is used as a piezoelectric/electrostrictive body, in addition to the advantage that the displacement can precisely be controlled, there are other advantages that the actuator has high electromechanical change efficiency, large generative force, high responsivity, high durability and small power consumption, and the actuator using these advantages is employed in a head of an ink jet printer, an injector of a diesel engine or the like.

As the piezoelectric/electrostrictive porcelain composition for the piezoelectric/electrostrictive actuator, heretofore, a Pb(Zr, Ti)O$_3$(PZT)-type piezoelectric/electrostrictive porcelain composition has been used, but there has been a strong fear of an influence of solute of lead from the sintered body on global environments, and hence an (Li, Na, K)(Nb, Ta)O$_3$ type piezoelectric/electrostrictive porcelain composition has been investigated.

An (Li, Na, K)(Nb, Ta)O$_3$ type piezoelectric material is usually sintered in the air or an oxygen atmosphere at 1020 to 1250° C. for 0.15 to 4 hours (e.g., Non-Patent Documents 1 to 3). A heating rate to reach a firing temperature is 200° C./h or 300° C./h, and the temperature rises at a constant heating rate from room temperature to the firing temperature (e.g., Patent Document 1).

There is also a research example in which the temperature is kept in a range of 600 to 650° C. for 1 to 5 hours in the heating process, whereby an organic binder added to improve formability of powder is removed (a de-binder process) (e.g., Patent Document 1). Microstructure of the sintered body includes grains of around 10 μm (e.g., Non-Patent Document 1) Moreover, there is a study example aimed at orientation structure of the sintered body (e.g., Non-Patent Document 4).

[Non-Patent Document 1] M. Matsubara et al., Japanese Journal of Applied Physics 44 (2005) pp. 6136-6142.

[Non-Patent Document 2] E. Hollenstein et al., Applied Physics Letters 87 (2005) 182905

[Non-Patent Document 3] Y. Guo et al., Applied Physics Letters 85 (2004) 4121

[Patent Document 1] JP-A-2006-028001

[Non-Patent Document 4] Y. Saito et al., Nature 432, 84-87 (2004)

DISCLOSURE OF THE INVENTION

Problem to be Solved by the Invention

Conventionally, study has been conducted aiming at a microstructure or orientation structure having small and uniform grain diameter for the purpose of improving electric characteristics. However, it is still hard to say that sufficient electric characteristics such as electric-field-induced strain are obtained and piezoelectric materials in which the electric characteristics are further improved are in demand.

The purpose of the present invention is to provide piezoelectric materials in which electric characteristics are further improved and manufacturing methods thereof.

SUMMARY OF THE INVENTION

The inventors of the present invention found out that manufacturing piezoelectric materials including sintered bodies having surface microstructures that include microscopic grains, intermediate grains, and coarse grains solves the above-mentioned problems. That is, according to the present invention, the following piezoelectric materials and manufacturing methods thereof are provided.

[1] A (Li, Na, K)(Nb, Ta)O$_3$ based piezoelectric material for a sintered body having surface microstructure that includes microscopic grains having a grain diameter of less than 5 μm, intermediate grains having a grain diameter of 5 μm or more and less than 15 μm, and coarse grains having a grain diameter of 15 μm or more and 100 μm or less.

[2] The (Li, Na, K)(Nb, Ta)O$_3$ based piezoelectric material described in the above [1], which includes 10 to 60% of the microscopic grains and 1% or more of the coarse grains in the share of grains in terms of area.

[3] The (Li, Na, K)(Nb, Ta)O$_3$ based piezoelectric material described in the above [1] or [2], expressed by a composition formula: $\{Li_y(Na_{1-x}K_x)_{1-y}\}_a(Nb_{1-z}Ta_z)O_3$ (here, $0.90 \leq a \leq 1.2$, $0.2 \leq x \leq 0.8$, $0.02 \leq y \leq 0.2$, and $0.05 \leq z \leq 0.5$).

[4] The (Li, Na, K)(Nb, Ta)O$_3$ based piezoelectric material described in any one of the above [1] to [3] containing at least one metal element selected from the group consisting of Mn, Cr, Fe, Co, Ni, Cu, and Zn.

[5] A manufacturing method of a (Li, Na, K)(Nb, Ta)O$_3$ based piezoelectric material, wherein chemical compounds having metal elements are mixed so as to have a composition expressed by (Li, Na, K)(Nb, Ta)O$_3$, the mixture is calcined and crushed to obtain a calcined/crushed powder, then, in a constant temperature keeping process, temperature is kept constantly at a predetermined temperature within a range from 800 to 900° C. for a predetermined period of time during a heating process, and then temperature is raised to firing temperature for sintering.

[6] The manufacturing method of a (Li, Na, K)(Nb, Ta)O$_3$ based piezoelectric material described in the above [5], wherein in the constant temperature keeping process the temperature is kept for a predetermined period of time within a range from 3 to 10 hours.

[7] The manufacturing method of a (Li, Na, K)(Nb, Ta)O$_3$ based piezoelectric material described in the above [5] or [6], wherein the calcined/crushed powder is sintered after at least one metal element selected from the group consisting of Mn, Cr, Fe, Co, Ni, Cu, and Zn is added to the powder.

Manufacturing (Li, Na, K)(Nb, Ta)O$_3$ based piezoelectric materials containing microscopic grains having a grain diameter of less than 5 μm, intermediate grains having a grain diameter of 5 μm or more and less than 15 μm, and coarse grains having a grain diameter of 15 μm or more and 100 μm or less enables to obtain a piezoelectric material having superior electric characteristics such as electric-field-induced strain, compared with the conventional ones.

After the material expressed by (Li, Na, K)(Nb, Ta)O$_3$ is calcined and crushed, in the constant temperature keeping process, temperature is kept constantly at a predetermined temperature within a range from 800 to 900° C. for a predetermined period of time, and thereafter temperature is raised to the firing temperature to carry out sintering so that the above-mentioned piezoelectric material containing microscopic grains, intermediate grains, and coarse grains is manufactured and as a result, a piezoelectric material having superior electric characteristics such as electric-field-induced strain can be manufactured.

BRIEF DESCRIPTION OF THE DRAWINGS

[FIG. 5] An SEM photograph showing surface microstructure of Comparative Example 3.

BEST MODE FOR CARRYING OUT THE INVENTION

Figure 1:
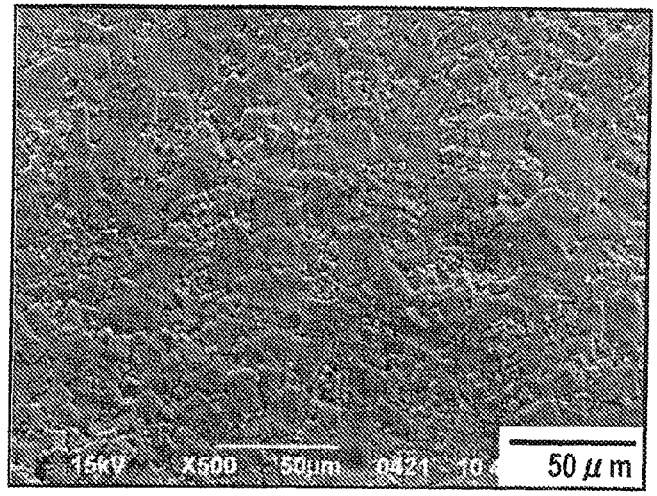
[FIG. 1] An SEM photograph showing surface microstructure of Example 2.

Hereinafter, embodiments of the present invention will be explained with reference to figures. The present invention is not limited to the following embodiments, and modifications, variations, and improvement can be carried out within the scope of the present invention.

The (Li, Na, K)(Nb, Ta)O$_3$ based piezoelectric material of the present invention has a sintered body having surface microstructure that include microscopic grains having a grain diameter of less than 5 μm, intermediate grains having a grain diameter of 5 μm or more and less than 15 μm, and coarse grains having a grain diameter of 15 μm or more and 100 μm or less. Here, the grain diameter means a diameter corresponding to the diameter of a circle having an area equal to the individual grain when the surface of the sintered body is observed by an SEM or the like. Specifically, it is preferable to include 10 to 60% of microscopic grains and 1% or more of coarse grains in the share in terms of area. Here, the term "share in terms of area" means percents of grains belonging to the respective groups classified in the diameter as mentioned above, based on the total of the area of all grains; said area being calculated by using the diameter determined as mentioned above, and the share being calculated as a percent(s) using the sum of the area of grains belonging to the respective groups in the total area of all grains measured.

Moreover, the (Li, Na, K)(Nb, Ta)O$_3$ based piezoelectric material of the present invention has a perovskite structure in which A site includes at least one kind of ion selected from the group consisting of Li, Na, and K, while B site includes at least one kind of ion selected from the group consisting of Nb and Ta.

More specifically, the (Li, Na, K)(Nb, Ta)O$_3$ based piezoelectric material of the present invention can be expressed by the following composition formula (1).

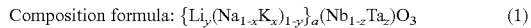

Composition formula: $\{Li_y(Na_{1-x}K_x)_{1-y}\}_a(Nb_{1-z}Ta_z)O_3$ (1)

(here, $0.90 \leq a \leq 1.2$, $0.2 \leq x \leq 0.8$, $0.02 \leq y \leq 0.2$, and $0.05 \leq z \leq 0.5$).

Here, with regard to an A/B ratio (=a), $a \leq 1.2$ is set. This is because when this range is exceeded, a dielectric loss increases, and the electric-field-induced strain during application of a high electric field tends to decrease. The increase of the dielectric loss raises a large problem in a piezoelectric/electrostrictive porcelain composition for an actuator to which the high electric field is applied. On the other hand, $0.90 \leq a$ is set to promote the grain growth and densify the material. When the ratio is below this range, heating at 1100° C. or more is required to promote the grain growth. In this case, evaporation of alkali components easily occurs, the composition fluctuates, and thus the characteristics become unstable. In the present invention, it is especially preferable to set $1.005 \leq a$. In this case, the densification and the grain growth are effectively performed, the firing temperature can be set to 1100° C. or less, and the fluctuation of the composition can be avoided. It is assumed that this is because, due to the existence of redundant alkaline elements, other phases (low-melting point phases) are synthesized in the sintering process.

Moreover, K, Li and Ta amounts are set to $0.2 \leq x \leq 0.8$, $0.02 \leq y \leq 0.2$ and $0.05 \leq z \leq 0.5$, respectively. This is because the piezoelectric/electrostrictive porcelain composition suitable for the actuator can be obtained in this range. For example, when x is below this range, piezoelectric/electrostrictive characteristics rapidly deteriorate. On the other hand, when x exceeds this range, it becomes difficult to perform the sintering, and the firing temperature has to be raised. It is not preferable to raise the firing temperature, because when the firing temperature is raised, the alkali components contained in the piezoelectric/electrostrictive porcelain composition evaporate, and the piezoelectric/electrostrictive characteristics cannot stably be obtained.

Moreover, when y is below this range, it also becomes difficult to perform the sintering, and the firing temperature has to be raised. On the other hand, the amount of the other phase increases, while an insulating characteristics is deteriorated, when y exceeds this range.

Furthermore, when z is below this range, the piezoelectric/electrostrictive characteristics deteriorate. On the other hand, when z exceeds this range, it also becomes difficult to perform the sintering, and the firing temperature has to be raised.

Further, the (Li, Na, K)(Nb, Ta)O$_3$ based piezoelectric material of the present invention contains at least one kind of metal element selected from the group consisting of Mn, Cr, Fe, Co, Ni, Cu, and Zn. The above-mentioned elements can be contained in grains, grain boundaries, or other phases as oxides. It is preferable that the metal elements being accessory ingredients are contained in a manner that content thereof is 3 mol % or less with respect to 100 mol % of perovskite oxide in terms of metal atoms. The reason why the content is set to 3 mol % or less is that, if the content exceeds this range, there is a tendency that the dielectric loss increases, and electric-field-induced strain during application of a high electric field tends to decrease.

Next, the manufacturing method of a (Li, Na, K)(Nb, Ta)O$_3$ based piezoelectric material of the present invention will be explained. First, raw material powder is synthesized. Chemical compounds containing each of metal elements are weighted so that ratio (mol ratio) of each of the metal elements in the composition of the raw material powder can be fulfilled. The chemical compounds are then mixed with solvent such as ethanol by a mix method such as ball milling to obtain mixture of slurry. Here, types of chemical compounds containing each of the metal elements are not especially limited. Oxides of each metal element or carbonates are preferably used, and, for example, lithium carbonate, potassium tartrate, sodium tartrate, niobium oxide, and tantalum oxide can be used.

The mixture of slurry is dried by use of a drier or by operation such as percolation. The mixture is calcined, and then crushed. Crushing can be carried out by the method of ball milling or the like. Thus, a raw material powder (calcined/crushed powder) is manufactured.

It is preferable that an average grain diameter of the raw material powder which is calcined/crushed powder is between 0.1 and 1 µm. Here, the average grain diameter is 50% diameter (median size) in cumulative distribution.

After adding at least one kind of metal element selected from the group consisting of Mn, Cr, Fe, Co, Ni, Cu, and Zn to the calcined/crushed (Li, Na, K)(Nb, Ta)O$_3$ powder, the powder is formed into pellets and then the pellets are sintered. Sintering is carried out in a following manner: A constant temperature keeping process wherein a temperature is kept constantly at a predetermined temperature within the range from 800 to 900° C. for a predetermined period of time is carried out in a heating process, and then temperature is raised to firing temperature. It is preferable that the predetermined period of time is within the range from 3 to 10 hours in the constant temperature keeping process. Especially, it is more preferable that the predetermined temperature is within the range from 840 to 860° C.

Then, the sintered body is machined into an appropriate shape (e.g., strip shape), depending on the necessity, polarized, and used as piezoelectric materials. Polarization process is carried out by applying voltage of about 5 kV/mm to the piezoelectric materials for 15 minutes or more.

As mentioned above, manufacturing a sintered body containing microscopic grains having a grain diameter of less than 5 µm, intermediate grains having a grain diameter of 5 µm or more and less than 15 µm, and coarse grains having a grain diameter of 15 µm or more and 100 µm or less enables to improve electric characteristics (electric-field-induced strain, relative dielectric constant, piezoelectric constant, dielectric loss, and the like). In order to obtain the sintered bodies, it is preferable that an additive such as MnO$_2$ is added to the calcined/crushed powder for forming (Li, Na, K)(Nb, Ta)O$_3$ based piezoelectric materials. Moreover, it is preferable that the constant temperature keeping process wherein temperature is kept constantly at a predetermined temperature for a predetermined period of time is inserted in the heating process from room temperature to firing temperature in the sintering schedule. As a result, sintered bodies having the above-mentioned microscopic structure are obtained, and electric characteristics can be improved. It is assumed that electric characteristics are improved because internal stress is applied to the sintered bodies.

EXAMPLE

Hereinafter, the present invention will be explained in more detail on the basis of Examples. However, the present invention is not limited thereto.

Comparative Example 1

Figure 4:
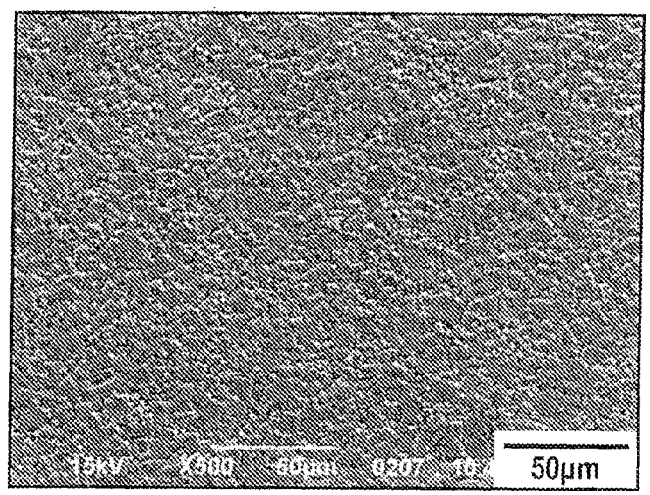
[FIG. 4] An SEM photograph showing surface microstructure of Comparative Example 1.

A calcined/crushed powder (particle diameters of 0.2 to 0.5 µm, a particle shape was spherical) constituted of a composition of $\{Li_y(Na_{1-x}K_x)_{1-y}\}_a(Nb_{1-z}Ta_z)O_3$ (x=0.450, y=0.060, z=0.082, and a=1.01)+0.02 mol % MnO$_2$ was formed into pellets (pellet-like sample). The pellet-like sample was heated in a furnace at a heating rate of 200° C./h to a firing temperature of 970° C. in the air. After retaining at 970° C. for 3 hours, the sample was cooled in the furnace. An X-ray diffraction profile was measured and c/a which is ratio of c axis to a axis (tetragonality) was calculated using diffraction angles which were middle points of full width at half maximum of diffraction line profiles. Surface microstructure of the sintered body was observed by a scanning electron microscope (SEM). Bulk density was measured by Archimedean method. From the surface microstructure of the sintered body (refer to SEM photograph in FIG. 4), grain size distribution by the diameter corresponding to the diameter of a circle having an area equal to the area of grain was analyzed, taking the vertical axis as the standard for calculating a share of grains in terms of the area. After machining this sintered body into strips, the strips were polarized in silicon oil under the condition of 5 kV/mm×15 min. (at room temperature). And then, electric characteristics (relative dielectric constant ε, piezoelectric constant d$_{31}$, dielectric loss tan δ, electric-field-induced strain S4000, temperature T$_{OT}$ where dielectric constant becomes maximum when heated, etc) were evaluated. The term "S4000" is the amount of strain in 31 direction; that is, direction vertical to an electric field applying direction at a time when an electric field of 4 kV/mm was applied. The results are shown in Tables 1 and 2.

Example 1

After the pellet-like sample described in the Comparative Example 1 was heated in the furnace at a heating rate of 200° C./h to 800° C. in the air, and kept at 800° C. for 3 hours, then the temperature was raised at a heating rate of 200° C./h to a firing temperature of 970° C. After retaining the temperature at 970° C. for 3 hours, the sample was cooled in the furnace. From the surface microstructure of the sintered body, grain size distribution by diameter corresponding to the diameter of a circle having an area equal to the area of grain was analyzed, taking the vertical axis as the standard for calculating a share of grains in terms of the area. The characteristics and the crystal structure were evaluated in the same manner as in the Comparative Example 1. The results are shown in Table 1.

Example 2

After the pellet-like sample described in the Comparative Example 1 was heated in the furnace at a heating rate of 200° C./h to 850° C. in the air, and kept at 850° C. for 3 hours, then the temperature was raised at a heating rate of 200° C./h to a firing temperature of 970° C. After retaining the temperature at 970° C. for 3 hours, the sample was cooled in the furnace. From the surface microstructure of the sintered body (refer to SEM photo in FIG. 1), grain size distribution by diameter corresponding to the diameter of a circle having an area equal to the area of grain was analyzed, taking the vertical axis as the standard for calculating a share of grains in terms of the area. The characteristics and the crystal structure were evaluated in the same manner as in the Comparative Example 1. The results are shown in Tables 1 to 3.

Example 3

After the pellet-like sample described in the Comparative Example 1 was heated in the furnace at a heating rate of 200° C./h to 900° C. in the air, and kept at 900° C. for 3 hours, then the temperature was raised at a heating rate of 200° C./h to a firing of 970° C. After retaining the temperature at 970° C. for 3 hours, the sample was cooled in the furnace. From the surface microstructure of the sintered body, grain size distribution by diameter corresponding to the diameter of a circle having an area equal to the area of grain was analyzed, taking the vertical axis as the standard for calculating a share of grains in terms of the area. The characteristics and the crystal structure were evaluated in the same manner as in the Comparative Example 1. The results are shown in Table 1.

Comparative Example 2

After the pellet-like sample described in the Comparative Example 1 was heated in the furnace at a heating rate of 200°

C./h to 950° C. in the air, and kept at 950° C. for 3 hours, then the temperature was raised at a heating rate of 200° C./h to a firing of 970° C. After retaining the temperature at 970° C. for 3 hours, the sample was cooled in the furnace. From the surface microstructure of the sintered body, grain size distribution by diameter corresponding to the diameter of a circle having an area equal to the area of grain was analyzed, taking the vertical axis as the standard for calculating a share of grains in terms of the area. The characteristics and the crystal structure were evaluated in the same manner as in the Comparative Example 1. The results are shown in Table 1.

Example 4

Figure 2:
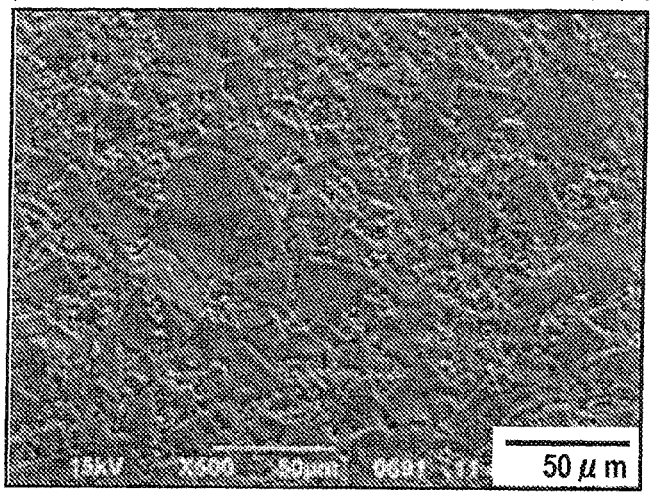
[FIG. 2] An SEM photograph showing surface microstructure of Example 4.

After the pellet-like sample described in the Comparative Example 1 was heated in the furnace at a heating rate of 200° C./h to 850° C. in the air, and kept at 850° C. for 6 hours, then the temperature was raised at a heating rate of 200° C./h to a firing temperature of 970° C. After retaining the temperature at 970° C. for 3 hours, the sample was cooled in the furnace. From the surface microstructure of the sintered body (refer to SEM photo in FIG. 2), grain size distribution by diameter corresponding to the diameter of a circle having an area equal to the area of grain was analyzed, taking the vertical axis as the standard for calculating a share of grains in terms of the area. The characteristics and the crystal structure were evaluated in the same manner as in the Comparative Example 1. The results are shown in Table 2.

Example 5

Figure 3:
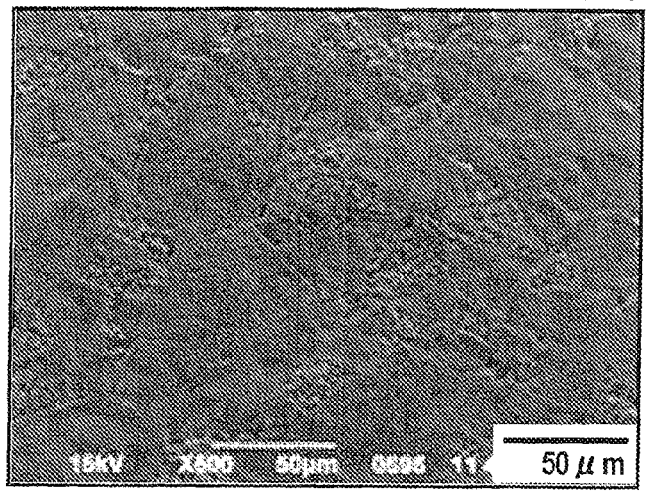
[FIG. 3] An SEM photograph showing surface microstructure of Example 5.

After the pellet-like sample described in the Comparative Example 1 was heated in the furnace at a heating rate of 200° C./h to 850° C. in the air, and kept at 850° C. for 10 hours, then the temperature was raised at a heating rate of 200° C./h to a firing temperature of 970° C. After retaining the temperature at 970° C. for 3 hours, the sample was cooled in the furnace. From the surface microstructure of the sintered body (refer to SEM photo in FIG. 3), grain size distribution by diameter corresponding to the diameter of a circle having an area equal to the area of grain was analyzed, taking the vertical axis as the standard for calculating a share of grains in terms of the area. The characteristics and the crystal structure were evaluated in the same manner as in the Comparative Example 1. The results are shown in Table 2.

Comparative Example 3

After the pellet-like sample described in the Comparative Example 1 was heated in the furnace at a heating rate of 200° C./h to 850° C. in the air, and kept at 850° C. for 20 hours, then the temperature was raised at a heating rate of 200° C./h to a firing temperature of 970° C. After retaining the temperature at 970° C. for 3 hours, the sample was cooled in the furnace. From the surface microstructure of the sintered body (refer to SEM photo in FIG. 5), grain size distribution by diameter corresponding to the diameter of a circle having an area equal to the area of grain was analyzed, taking the vertical axis as the standard for calculating a share of grains in terms of the area. The characteristics and the crystal structure were evaluated in the same manner as in the Comparative Example 1. The results are shown in Table 2.

Comparative Example 4

Calcined/crushed powders (particle diameters of 0.2 to 0.5 μm, a particle shape was spherical) constituted of a composition of $\{Li_y(Na_{1-x}K_x)_{1-y}\}_a(Nb_{1-z}Ta_z)O_3$ (x=0.450, y=0.060, z=0.082, and a=1.01) was formed into pellets (pellet-like sample). The pellet-like sample was heated in the furnace at a heating rate of 200° C./h to 850° C. in the air, and kept at 850° C. for 3 hours, then the temperature was raised at a heating rate of 200° C./h to a firing temperature of 1050° C. After retaining the temperature at 1050° C. for 3 hours, the sample was cooled in the furnace. From the surface microstructure of the sintered body grain size distribution by diameter corresponding to the diameter of a circle having an area equal to the area of grain was analyzed, taking the vertical axis as the standard for calculating a share of grains in terms of the area. The characteristics and the crystal structure were evaluated in the same manner as in the Comparative Example 1. The results are shown in Table 3.

Example 6

Calcined/crushed powders (particle diameters of 0.2 to 0.5 μm, a particle shape was spherical) constituted of a composition of $\{Li_y(Na_{1-x}K_x)_{1-y}\}_a(Nb_{1-z}Ta_z)O_3$ (x=0.450, y=0.060, z=0.082, and a=1.01)+0.01 mol % $Cr_2O_3$ was formed into pellets (pellet-like sample). The pellet-like sample was heated in the furnace at a heating rate of 200° C./h to 850° C. in the air, and kept at 850° C. for 3 hours, then the temperature was raised at a heating rate of 200° C./h to a firing temperature of 970° C. After retaining the temperature at 970° C. for 3 hours, the sample was cooled in the furnace. From the surface microstructure of the sintered body grain size distribution by diameter corresponding to the diameter of a circle having an area equal to the area of grain was analyzed, taking the vertical axis as the standard for calculating a share of grains in terms of the area. The characteristics and the crystal structure were evaluated in the same manner as in the Comparative Example 1. The results are shown in Table 3.

Example 7

Calcined/crushed powders (particle diameters of 0.2 to 0.5 μm, a particle shape was spherical) constituted of a composition of $\{Li_y(Na_{1-x}K_x)_{1-y}\}_a(Nb_{1-z}Ta_z)O_3$ (x=0.450, y=0.060, z=0.082, and a=1.01)+0.01 mol % $Fe_2O_3$ was formed into pellets (pellet-like sample). The pellet-like sample was heated in the furnace at a heating rate of 200° C./h to 850° C. in the air, and kept at 850° C. for 3 hours, then the temperature was raised at a heating rate of 200° C./h to a firing temperature of 970° C. After retaining the temperature at 970° C. for 3 hours, the sample was cooled in the furnace. From the surface microstructure of the sintered body grain size distribution by diameter corresponding to the diameter of a circle having an area equal to the area of grain was analyzed, taking the vertical axis as the standard for calculating a share of grains in terms of the area. The characteristics and the crystal structure were evaluated in the same manner as in the Comparative Example 1. The results are shown in Table 3.

Example 8

Calcined/crushed powders (particle diameters of 0.2 to 0.5 μm, a particle shape was spherical) constituted of a composition of $\{Li_y(Na_{1-x}K_x)_{1-y}\}_a(Nb_{1-z}Ta_z)O_3$ (x=0.450, y=0.060, z=0.082, and a=1.01)+0.02 mol % CoO was formed into pellets (pellet-like sample). The pellet-like sample was heated in the furnace at a heating rate of 200° C./h to 850° C. in the air, and kept at 850° C. for 3 hours, then the temperature was raised at a heating rate of 200° C./h to a firing temperature of 970° C. After retaining the temperature at 970° C. for 3 hours, the sample was cooled in the furnace. From the surface microstructure of the sintered body grain size distribution by diameter corresponding to the diameter of a circle having an area equal to the area of grain was analyzed, taking the vertical axis as the standard for calculating a share of grains in terms of the area. The characteristics and the crystal structure were evaluated in the same manner as in the Comparative Example 1. The results are shown in Table 3.

Example 9

Calcined/crushed powders (particle diameters of 0.2 to 0.5 µm, a particle shape was spherical) constituted of a composition of $\{Li_y(Na_{1-x}K_x)_{1-y}\}_a(Nb_{1-z}Ta_z)O_3$ (x=0.450, y=0.060, z=0.082, and a=1.01)+0.02 mol % NiO was formed into pellets (pellet-like sample). The pellet-like sample was heated in the furnace at a heating rate of 200° C./h to 850° C. in the air, and kept at 850° C. for 3 hours, then the temperature was raised at a heating rate of 200° C./h to a firing temperature of 970° C. After retaining the temperature at 970° C. for 3 hours, the sample was cooled in the furnace. From the surface microstructure of the sintered body grain size distribution by diameter corresponding to the diameter of a circle having an area equal to the area of grain was analyzed, taking the vertical axis as the standard for calculating a share of grains in terms of the area. The characteristics and the crystal structure were evaluated in the same manner as in the Comparative Example 1. The results are shown in Table 3.

Example 10

Calcined/crushed powders (particle diameters of 0.2 to 0.5 µm, a particle shape was spherical) constituted of a composition of $\{Li_y(Na_{1-x}K_x)_{1-y}\}_a(Nb_{1-z}Ta_z)O_3$ (x=0.450, y=0.060, z=0.082,. and a=1.01)+0.02 mol % CuO was formed into pellets (pellet-like sample). The pellet-like sample was heated in the furnace at a heating rate of 200° C./h to 850° C. in the air, and kept at 850° C. for 3 hours, then the temperature was raised at a heating rate of 200° C./h to a firing temperature of 970° C. After retaining the temperature at 970° C. for 3 hours, the sample was cooled in the furnace. From the surface microstructure of the sintered body grain size distribution by diameter corresponding to the diameter of a circle having an area equal to the area of grain was analyzed, taking the vertical axis as the standard for calculating a share of grains in terms of the area. The characteristics and the crystal structure were evaluated in the same manner as in the Comparative Example 1. The results are shown in Table 3.

Example 11

Calcined/crushed powders (particle diameters of 0.2 to 0.5 µm, a particle shape was spherical) constituted of a composition of $\{Li_y(Na_{1-x}K_x)_{1-y}\}_a(Nb_{1-z}Ta_z)O_3$ (x=0.450, y=0.060, z=0.082, and a=1.01)+0.02 mol % ZnO was formed into pellets (pellet-like sample). The pellet-like sample was heated in the furnace at a heating rate of 200° C./h to 850° C. in the air, and kept at 850° C. for 3 hours, then the temperature was raised at a heating rate of 200° C./h to a firing temperature of 970° C. After retaining the temperature at 970° C. for 3 hours, the sample was cooled in the furnace. From the surface microstructure of the sintered body grain size distribution by diameter corresponding to the diameter of a circle having an area equal to the area of grain was analyzed, taking the vertical axis as the standard for calculating a share of grains in terms of the area. The characteristics and the crystal structure were evaluated in the same manner as in the Comparative Example 1. The results are shown in Table 3.

TABLE 1

|  |  | Comparative Example 1 | Example 1 | Example 2 | Example 3 | Comparative Example 2 |
|---|---|---|---|---|---|---|
| Keeping temperature | | Not kept | 800° C. | 850° C. | 900° C. | 950° C. |
| Relative density | | 94.80% | 95.00% | 96.00% | 95.80% | 93.90% |
| Relative dielectric constant | | 851 | 860 | 876 | 859 | 839 |
| d31 | | 71 pm/V | 72 pm/V | 82 pm/V | 72 pm/V | 67 pm/V |
| tanδ | | 1.35% | 1.34% | 1.07% 12 | 1.32% | 1.34% |
| S4000 | | 550 ppm | 580 ppm | 600 ppm | 590 ppm | 570 ppm |
| c/a | | 1.0200 | 1.0203 | 1.0207 | 1.0205 | 1.0201 |
| $T_{OT}$ | | 47° C. | 43° C. | 38° C. | 40° C. | 45° C. |
| Grain size distribution | Microscopic grain | 55% | 58% | 29% | 51% | 50% |
| | Intermediate grain | 45% | 41% | 38% | 46% | 50% |
| | Coarse grain | 0% | 1% | 33% | 3% | 0% |
| Maximum grain diameter | | Less than 15 µm | 15 µm | 25 µm | 20 µm | Less than 15 µm |

Here in Table 1, the added element was Mn, keeping time was 3 hours, and keeping temperature was changed. These characteristics were evaluated at room temperature and relative density was calculated on the basis of real density of 4.7 g/cm³. Moreover, relative dielectric constants and piezoelectric constants were values after polarization, and grain diameter of the microscopic grain was less than 5 µm, that of the intermediate grain was 5 µm or more and less than 15 µm, and that of the coarse grain was 15 µm or more. Ratio of the grains was calculated by, taking the vertical axis as the standard for calculating a share of grains in terms of the area.

TABLE 2

|  | | Comparative Example 1 | Example 2 | Example 4 | Example 5 | Comparative Example 3 |
|---|---|---|---|---|---|---|
| Keeping time | | Not kept | 3 hours | 6 hours | 10 hours | 20 hours |
| Relative density | | 94.80% | 96.00% | 95.70% | 95.30% | 95.30% |
| Relative dielectric constant | | 851 | 876 | 879 | 1006 | 840 |
| d31 | | 71 pm/V | 82 pm/V | 80 pm/V | 87 pm/V | 55 pm/V |
| tanδ | | 1.35% | 1.07% | 1.04% | 0.89% | 1.21% |
| S4000 | | 550 ppm | 600 ppm | 610 ppm | 700 ppm | 430 ppm |
| c/a | | 1.0200 | 1.0207 | 1.0208 | 1.0210 | 1.0213 |
| $T_{OT}$ | | 47° C. | 38° C. | 32° C. | 21° C. | 15° C. |
| Grain size distribution | Microscopic grain | 55% | 29% | 19% | 17% | 14% |
| | Intermediate grain | 45% | 38% | 40% | 2% | 1% |
| | Coarse grain | 0% | 33% | 41% | 81% | 85% |
| Maximum grain diameter | | Less than 15 μm | 25 μm | 60 μm | 100 μm | 200 μm |

Here in Table 2, the added element was Mn, keeping temperature was 850° C., and keeping time was changed. Other measuring conditions were the same as those in Table 1.

TABLE 3

|  | | Comparative Example 4 | Example 2 | Example 6 | Example 7 | Example 8 | Example 9 | Example 10 | Example 11 |
|---|---|---|---|---|---|---|---|---|---|
| Added element | | None | Mn | Cr | Fe | Co | Ni | Cu | Zn |
| Relative density | | 94.10% | 96.00% | 95.80% | 95.60% | 95.40% | 95.30% | 95.20% | 95.00% |
| Relative-dielectric constant | | 790 | 876 | 865 | 859 | 857 | 857 | 856 | 855 |
| d31 | | 44 pm/V | 82 pm/V | 80 pm/V | 79 pm/V | 77 pm/V | 76 pm/V | 75 pm/V | 74 pm/V |
| tanδ | | 1.95% | 1.07% | 1.10% | 1.14% | 1.20% | 1.23% | 1.28% | 1.32% |
| S4000 | | 457 ppm | 600 ppm | 596 ppm | 592 ppm | 581 ppm | 578 ppm | 572 ppm | 569 ppm |
| c/a | | 1.0200 | 1.0207 | 1.0206 | 1.0206 | 1.0205 | 1.0204 | 1.0204 | 1.0203 |
| $T_{OT}$ | | 47° C. | 38° C. | 40° C. | 41° C. | 42° C. | 43° C. | 43° C. | 44° C. |
| Grain size distribution | Microscopic grain | 50% | 29% | 31% | 32% | 33% | 34% | 34% | 35% |
| | Intermediate grain | 50% | 38% | 38% | 39% | 40% | 40% | 41% | 42% |
| | Coarse grain | 0% | 33% | 31% | 29% | 27% | 26% | 25% | 23% |
| Maximum grain diameter | | Less than 15 μm | 25 μm | 25 μm | 25 μm | 23 μm | 23 μm | 23 μm | 21 μm |

Here in Table 3, keeping temperature was 850° C., keeping time was 3 hours, and added element was changed. Other measuring conditions were the same as those in Table 1.

In the above results, inserting the constant temperature keeping process between 800 and 900° C. in the sintering schedule enables to obtain sintered bodies containing microscopic grains having a grain diameter of less than 5 μm, the intermediate grains having a grain diameter of 5 μm or more and less than 15 μm, and the coarse grains having a grain diameter of 15 μm or more and to improve the electric-field-induced strain S4000. Especially, high effect was obtained in a case where MnO₂ is added (Example 2). Because relative density hardly changed, the relative density does not depend on sintering schedule, and degree of densification is not related to improvement of the characteristics. Meanwhile, if ratio of the coarse grains increases and maximum grain diameter becomes larger, c/a (tetragonality) of the sintered body becomes larger and TOT (temperature at which dielectric constant becomes maximum when heated) is lowered. Lowered $T_{OT}$ shows that the temperature range of tetragonal phase of the sintered body expands from high temperature to the vicinity of room temperature. However, if the sintered body is crushed and X-ray diffraction profile of the crushed powder is measured, irrespective of the original microstructure of the sintered body, c/a of the crushed powder is lowered, and all the samples show similar values. Therefore, microstructure shown in Examples 1 to 11 gives internal stress to the sintered body, and thereby a tetragonal phase has a stable crystal phase at room temperature, c/a becomes large, $T_{OT}$ is lowered, and electric characteristics such as the electric-field-induced strain are improved. However, if the maximum grain diameter of the coarse grains exceeds 100 μm, the characteristics are worsened (Comparative Example 3).

The following can be assumed regarding the mechanism which enables to obtain sintered bodies containing microscopic grains, intermediate grains, and coarse grains. The constant temperature keeping process in the range from 800 to 900° C. expands intergranular phases thinly and equally. Therefore, grain growth is suppressed; that is, energy for grain growth is accumulated. If a metal element such as Mn is taken in the intergranular phase, the melting point of the intergranular phase is lowered, and the intergranular phase is molten at firing temperature. At this time, accumulated energy for grain growth is released at once, and coarse grains grow. Grains on surfaces and in the vicinity of pores, which are not spacially continued, are not easily taken by the coarse grains and therefore become microscopic and intermediate grains.

Manufacturing sintered bodies containing microscopic grains having a grain diameter of less than 5 μm, intermediate grains having a grain diameter of 5 μm or more and less than 15 μm, and coarse grains having a grain diameter of 15 μm or more and 100 μm or less enables to obtain high electric characteristics (relative dielectric constant, piezoelectric constant, dielectric loss, electric-field-induced strain, and the like) It is assumed that this is because of the effect of internal stress. As methods to obtain such microstructures, it is effective that (1) an additive which mainly contains Mn, Cr, Fe, Co, Ni, Cu, or Zn is added to the calcined/crushed powder, and (2) a constant temperature keeping process in a temperature range where a firing contraction occurs (especially, between 800 and 900° C.) is inserted to the sintering schedule. According to the present method, S4000 which was 550 ppm could be improved up to 700 ppm.

INDUSTRIAL APPLICABILITY

The piezoelectric materials of the present invention shows superior electric-field-induced strain and are suitable as piezoelectric devices for actuators, sensors, or the like.

What is claimed is:

1. A (Li, Na, K) (Nb, Ta) $O_3$ based piezoelectric material comprising a sintered body having surface microstructure including microscopic grains having a grain diameter of less than 5 μm, intermediate grains having a grain diameter of 5 μm or more and less than 15 μm, and coarse grains having a grain diameter of 15 μm or more and 100 μm or less.

2. The (Li, Na, K) (Nb, Ta) $O_3$ based piezoelectric material according to claim 1, comprising 10 to 60% of the microscopic grains and 1% or more of the coarse grains, in a share of grains in terms of area.

3. The (Li, Na, K) (Nb, Ta) $O_3$ based piezoelectric material according to claim 1, expressed by a composition formula:

$$\{Li_y(Na_{1-x}K_x)_{1-y}\}_a(Nb_{1-z}Ta_z)O_3$$

wherein $0.90 \leq a \leq 1.2$, $0.2 \leq x \leq 0.8$, $0.02 \leq y \leq 0.2$, and $0.05 \leq z \leq 0.5$.

4. The (Li, Na, K) (Nb, Ta) $O_3$ based piezoelectric material according to claim 2, expressed by a composition formula:

$$\{Li_y(Na_{1-x}K_x)_{1-y}\}_a(Nb_{1-z}Ta_z)O_3$$

wherein $0.90 \leq a \leq 1.2$, $0.2 \leq x \leq 0.8$, $0.02 \leq y \leq 0.2$, and $0.05 \leq z \leq 0.5$.

5. The (Li, Na, K) (Nb, Ta) $O_3$ based piezoelectric material according to claim 1, further containing at least one metal element selected from the group consisting of Mn, Cr, Fe, Co, Ni, Cu, and Zn.

6. The (Li, Na, K) (Nb, Ta) $O_3$ based piezoelectric material according to claim 2, further containing at least one metal element selected from the group consisting of Mn, Cr, Fe, Co, Ni, Cu, and Zn.

7. The (Li, Na, K) (Nb, Ta) $O_3$ based piezoelectric material according to claim 3, further containing at least one metal element selected from the group consisting of Mn, Cr, Fe, Co, Ni, Cu, and Zn.

8. The (Li, Na, K) (Nb, Ta) $O_3$ based piezoelectric material according to claim 4, further containing at least one metal element selected from the group consisting of Mn, Cr, Fe, Co, Ni, Cu, and Zn.

* * * * *